US00RE43539E

(19) United States
(12) Reissued Patent
Takahashi

(10) Patent Number: US RE43,539 E
(45) Date of Reissued Patent: Jul. 24, 2012

(54) OUTPUT BUFFER CIRCUIT AND INTEGRATED SEMICONDUCTOR CIRCUIT DEVICE WITH SUCH OUTPUT BUFFER CIRCUIT

(75) Inventor: Tsugio Takahashi, Ibaraki (JP)

(73) Assignee: Elpida Memory, Inc., Tokyo (JP)

(21) Appl. No.: 11/798,773

(22) Filed: May 16, 2007

Related U.S. Patent Documents

Reissue of:
(64) Patent No.: 6,894,547
Issued: May 17, 2005
Appl. No.: 10/320,059
Filed: Dec. 16, 2002

(30) Foreign Application Priority Data

Dec. 19, 2001 (JP) ..... 2001-386126

(51) Int. Cl.
*H03K 19/094* (2006.01)

(52) U.S. Cl. ..... 327/170; 327/112; 327/374; 326/87

(58) Field of Classification Search ..... None
See application file for complete search history.

(56) References Cited

U.S. PATENT DOCUMENTS

| | | | |
|---|---|---|---|
| 4,719,369 | A | 1/1988 | Asano et al. |
| 4,855,623 | A | 8/1989 | Flaherty |
| 5,140,194 | A | 8/1992 | Okitaka |
| 5,500,610 | A | 3/1996 | Burstein |
| 5,773,999 | A | 6/1998 | Park et al. |
| 5,850,159 | A | 12/1998 | Chow et al. |
| 5,914,618 | A | 6/1999 | Mattos |
| 5,917,758 | A | 6/1999 | Keeth |
| 5,929,668 | A | 7/1999 | Kim |
| 6,066,958 | A | 5/2000 | Taniguchi et al. |
| 6,288,563 | B1 | 9/2001 | Muljono et al. |
| 6,320,433 | B1 | 11/2001 | Hinterscher |
| 6,466,487 | B1 | 10/2002 | Otsuka |
| 6,483,340 | B2 | 11/2002 | Uenishi |
| 6,559,676 | B1 | 5/2003 | Tomita |
| 6,573,753 | B1 | 6/2003 | Snyder |

FOREIGN PATENT DOCUMENTS

| | | |
|---|---|---|
| JP | 62-038616 | 2/1987 |
| JP | 01-154622 | 6/1989 |
| JP | 02-092019 | 3/1990 |
| JP | 05-047186 | 2/1993 |
| JP | 05-160707 | 6/1993 |
| JP | 05-175444 | 7/1993 |
| JP | 07-006587 | 1/1995 |
| JP | 09-093111 | 4/1997 |
| JP | 10-242835 | 9/1998 |
| JP | 11-017516 | 1/1999 |
| JP | 2000-332593 | 11/2000 |
| JP | 2001-007695 | 1/2001 |
| JP | 2001-068986 | 3/2001 |

*Primary Examiner* — Cassandra Cox
(74) *Attorney, Agent, or Firm* — McGinn IP Law Group, PLLC

(57) ABSTRACT

An output buffer circuit has a main driver including a first pMOS transistor and a first nMOS transistor for driving a load, and a second pMOS transistor and a second nMOS transistor for driving the load in coaction with the first pMOS transistor and the first nMOS transistor, and a predriver including a third pMOS transistor and a third nMOS transistor for driving the first pMOS transistor, a fourth pMOS transistor and a fourth nMOS transistor for driving the first nMOS transistor, a fifth nMOS transistor for driving the first pMOS transistor in coaction with the third nMOS transistor, and a fifth pMOS transistor for driving the first nMOS transistor in coaction with the fourth pMOS transistor.

16 Claims, 9 Drawing Sheets

( A )

OUTPUT BUFFER CIRCUIT AND INTEGRATED SEMICONDUCTOR CIRCUIT DEVICE WITH SUCH OUTPUT BUFFER CIRCUIT

Matter enclosed in heavy brackets [ ] appears in the original patent but forms no part of this reissue specification; matter printed in italics indicates the additions made by reissue.

BACKGROUND OF THE INVENTION

1. Field of the Invention

The present invention relates to an output buffer circuit for use in an integrated semiconductor circuit device, and more particularly to an output buffer circuit which is capable of adjusting the output impedance thereof according to control signals from an external source.

2. Description of the Related Art

Systems incorporating integrated semiconductor circuit devices in recent years employ memory devices such as DRAMs (Dynamic Random Access Memories) and SDRAMs (Synchronous DRAMs) which operate with a clock signal of several hundreds MHz as a result of processing operations at higher speeds. To meet lower power consumption requirements, there are also available integrated semiconductor circuit devices that operate at lower power supply voltages of about 1.5 V or lower.

It is important for systems operating at higher speeds and under low voltages to suppress variations in the driving capability and slew rate of the output buffer circuit of the integrated semiconductor circuit device in view of fluctuations in the power supply voltage and the ambient temperature and different device performance capabilities.

For example, Japanese patent applications laid-open Nos. 05-175444 and 2-092019 propose arrangements for adjusting the driving capability of an output buffer circuit by changing the output impedance thereof. Proposals disclosed in Japanese patent applications laid-open Nos. 2001-68986 and 2000-332593 adjust the slew rate of an output buffer circuit by changing the ratio of tr(rise time)/tf(fall time) of an output pulse waveform.

Integrated semiconductor circuit devices such as DDR (Double Data Rate)-SDRAMs receive data from a memory device which outputs data in timed relation to rising and falling edges of a system clock signal CLK (see FIG. 1 of the accompanying drawings). In such an integrated semiconductor circuit device, if the timing to sent data (a cross-point CP between rising and falling waveforms shown in FIG. 1) is shifted a one-half period (tck/2) from the system clock signal CLK, then the integrated semiconductor circuit device fails to receive the transmitted data correctly. Actual systems have a very narrow range (window) of allowable cross-point variations because of delays caused by interconnections, etc.

If the slew rate becomes lower, then since the amplitude of output pulses cannot reach a maximum value when the system operates at a high speed, the system fails to determine a logic level of "1" or "0" properly. Conversely, if the slew rate become higher, then high-frequency components increase to distort output pulses, thus increasing noise which tends to result in a system malfunction.

The above problems may be solved by compensating for variations in the cross-point CP and the slew rate at the data transmission side. However, variations in the cross-point CP and the slew rate cannot be compensated for simply by adjusting the output impedance. Only adjusting the slew rate fails to achieve a compensation within the allowable range of variations of the system which operates at a high speed and under a low voltage because the cross-point CP and the slew rate depend on variations of both the output impedance and the power supply voltage.

In particular, if only the slew rate is adjusted, when the high level of the output signal is lowered or the low level of the output signal is increased due to a reduction in the driving capability, the system becomes unable to determine a logic level of "1" or "0" properly.

The output impedance of an output buffer circuit can easily be detected for fluctuations by monitoring the load current and output level of the output buffer circuit even when the output buffer circuit is incorporated in a system. However, it is difficult to detect fluctuations of the slew rate of the output buffer circuit because the slew rate cannot easily be monitored.

The output buffer circuits disclosed in the above applications offer an arrangement for adjusting either one of the output impedance and the slew rate, and are disadvantageous in that variations in the cross-point CP and the slew rate of the disclosed output buffer circuits as they are incorporated in a system cannot sufficiently be compensated for against variations in the power supply voltage and the ambient temperature.

Controlling the cross-point and the slew rate needs to take the following problems into account:

Generally, systems having integrated semiconductor circuit devices such high-speed DDR-DRAMs or the like employ a phase synchronizing circuit such as a DLL (Delay Locked Loop) or a PLL (Phase Locked Loop) in order to synchronize data output from the output buffer circuit of the integrated semiconductor circuit device with the system clock signal. The phase synchronizing circuit uses a circuit having a delay similar to the delay in the output buffer circuit for monitoring the delay in the output buffer circuit. The phase synchronizing circuit generates a compensating clock signal for compensating for the monitored delay, and synchronizes the output from the output buffer circuit with the generated compensating clock signal.

If the output impedance and the slew rate of the output buffer circuit are adjusted to improve the system performance, then the data output timing of the output buffer circuit varies because of the adjustment of the output impedance and the slew rate thereof.

In order to synchronize the data output timing of the output buffer circuit accurately with the system clock signal, therefore, it is necessary for the circuit which monitors the delay in the output buffer circuit to adjust its own delay depending on variations in the delay in the output buffer circuit.

SUMMARY OF THE INVENTION

It is therefore an object of the present invention to provide an output buffer circuit which is capable of sufficiently compensating for variations in the cross-point between rising and falling waveforms of output pulses and variations in the slew rate against variations in the power supply voltage and the ambient temperature even when the output buffer circuit is incorporated in a system.

To achieve the above object, an output buffer circuit according to the present invention has a main driver for driving a load and a predriver for driving the main driver. The main driver has at least a pair of a first p-channel MOS transistor and a first n-channel MOS transistor for driving a load according to the data, and at least a pair of a second p-channel MOS transistor and a second n-channel MOS transistor for driving the load in coaction with the first p-channel MOS transistor and the first n-channel MOS transistor. The predriver has at least a pair of a third p-channel MOS transistor and a third n-channel MOS transistor for driving the first p-channel MOS transistor according to the data, at least a pair of a fourth p-channel MOS transistor and a fourth n-channel MOS transistor for driving the first n-channel MOS transistor according to the data, at least one fifth n-channel MOS transistor for driving the first p-channel MOS transistor in coaction with the third n-channel MOS transistor, and at least one fifth p-channel MOS transistor for driving the first n-channel MOS transistor in coaction with the fourth p-channel MOS transistor.

With the above arrangement, the number of transistors of the main driver for driving the load according to control signals and the number of transistors of the predriver are changed to simultaneously adjust the cross-point of output pulses and the slew rate as well as the output impedance with the same control signals. Consequently, the data receiving side connected to the output buffer circuit is prevented from malfunctioning, making it possible to achieve a system which operates normally even when the power supply voltage and the ambient temperature vary.

Since the output impedance and the rise and fall times of output pulses are simultaneously controlled, the number of control signals and the steps of a testing process are made smaller than if the output impedance and the rise and fall times of output pulses were controlled independently of each other. Thus, the manufacturing cost of the output buffer circuit is prevented from increasing.

The system incorporating the output buffer circuit has its performance capability increased because the slew rate is automatically improved by monitoring and adjusting only the output impedance of the output buffer circuit.

Another output buffer circuit according to the present invention has a main driver which is identical to the main driver described above, and a predriver including at least a pair of a third p-channel MOS transistor and a third n-channel MOS transistor for driving the first p-channel MOS transistor according to the data, at least a pair of a fourth p-channel MOS transistor and a fourth n-channel MOS transistor for driving the first n-channel MOS transistor according to the data, at least one fifth n-channel MOS transistor for driving the first p-channel MOS transistor in coaction with the third n-channel MOS transistor, at least one fifth p-channel MOS transistor for driving the first p-channel MOS transistor in coaction with the third p-channel MOS transistor, at least one sixth p-channel MOS transistor for driving the first n-channel MOS transistor in coaction with the fourth p-channel MOS transistor, and at least one sixth n-channel MOS transistor for driving the first n-channel MOS transistor in coaction with the fourth n-channel MOS transistor.

With the above arrangement, the driving capabilities of both the third n-channel MOS transistor and the third p-channel MOS transistor are similarly increased, and the driving capabilities of both the fourth p-channel MOS transistor and the fourth n-channel MOS transistor are similarly increased. Therefore, a through current is preventing from flowing through the first p-channel MOS transistor and the first n-channel MOS transistor, and hence noise is prevented from being produced and the current consumption is prevented from increasing due to such a through current.

An integrated semiconductor circuit device according to the present invention has the above output buffer circuit and a delay monitor circuit identical in circuit arrangement to the output buffer circuit and having transistors controlled according to the control signals in the same manner as with the output buffer circuit, the delay monitor circuit having an output terminal connected to a dummy load determined from an actual load of the output buffer circuit based on a transistor size ratio between the output buffer circuit and the delay monitor circuit.

Another integrated semiconductor circuit device according to the present invention has the above output buffer circuit and a delay monitor circuit comprising a plurality of capacitors for delaying the data output from the output buffer circuit by respective delays, and a plurality of switches for selectively enabling and disabling the capacitors to delay the data according to the control signals, the delay monitor circuit having an output terminal connected to a dummy load determined from an actual load of the output buffer circuit based on a transistor size ratio between the output buffer circuit and the delay monitor circuit.

With the above arrangements, since the delay monitor circuit reflects the adjusted values of the output impedance of the output buffer circuit and the ratio tr/tf of output pulses, a system clock signal and the data output from the output buffer circuit can be synchronized more accurately with each other.

The above and other objects, features, and advantages of the present invention will become apparent from the following description with reference to the accompanying drawings which illustrate examples of the present invention.

DETAILED DESCRIPTION OF THE PREFERRED EMBODIMENTS

A DRAM (including an SDRAM) as an example of an integrated semiconductor circuit device which incorporates an output buffer circuit according to the present invention will be described below.

Figure 1:
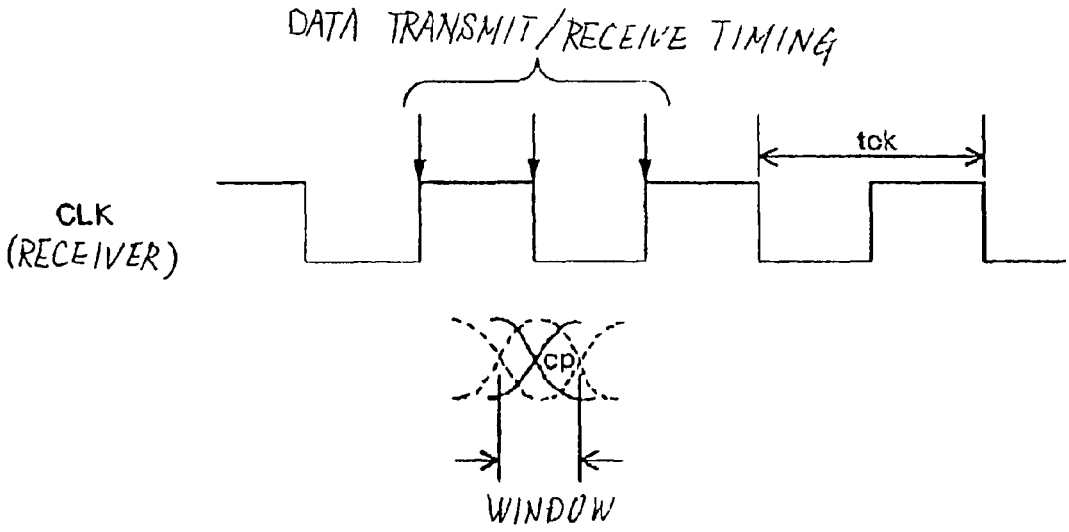
FIG. 1 (PRIOR ART)
FIG. 1 is a diagram illustrative of problems which arise when a conventional output buffer circuit is in operation.
Figure 2:
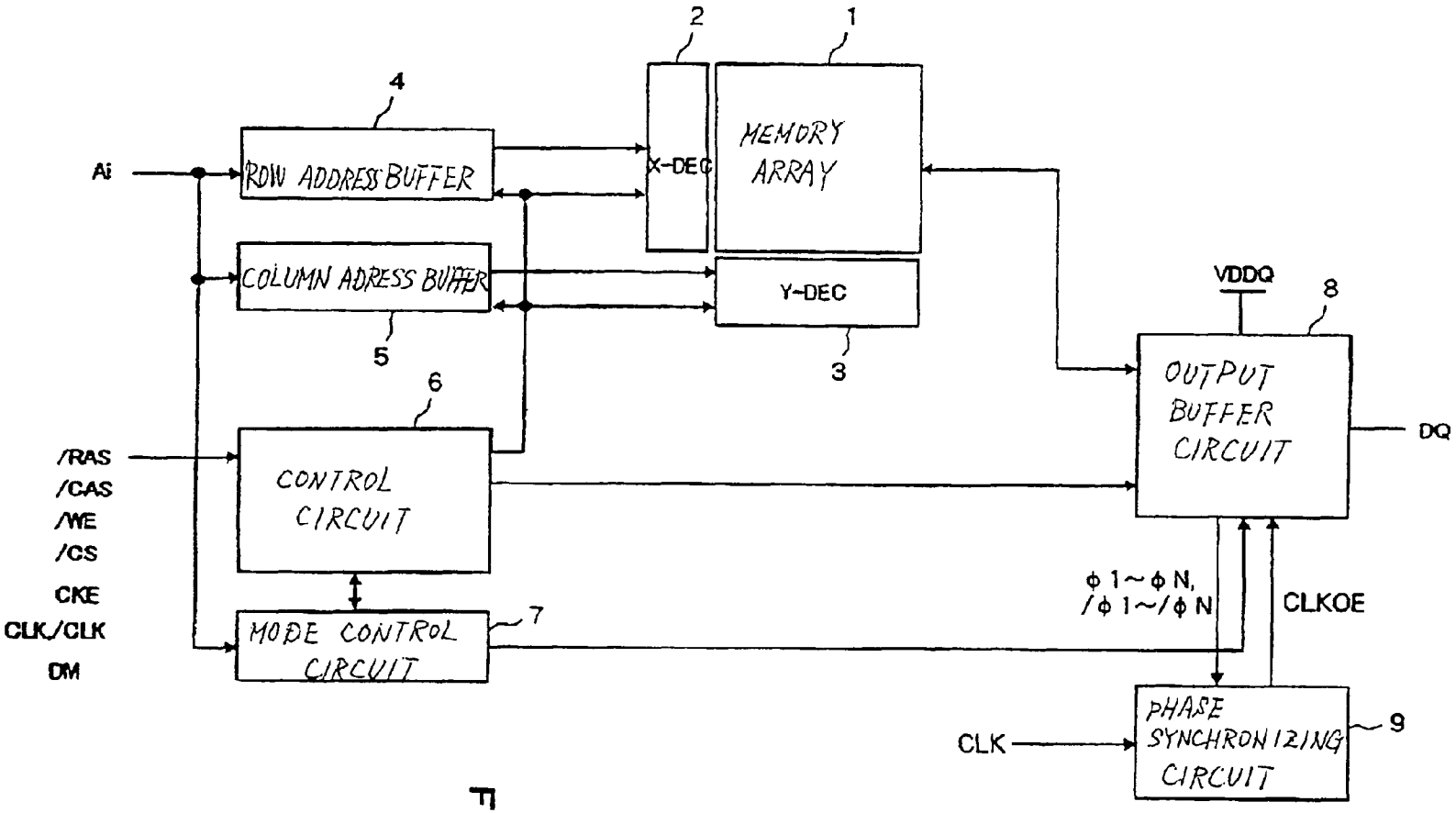
FIG. 2 is a block diagram of a DRAM as an integrated semiconductor circuit device incorporating an output buffer circuit according to the present invention.

As shown in FIG. 2, the DRAM comprises memory array 1 made up of a plurality of memory cells for storing data, X decoder (X-DEC) 2 and Y decoder (Y-DEC) 3 for decoding addresses Ai to access memory cells for writing data therein and reading data therefrom, ROW address buffer 4 and COLUMN address buffer 5 for temporarily holding addresses entered from an external source, control circuit 6 for controlling operation of the DRAM according to various control signals supplied from an external source, mode control circuit 7 for operating the DRAM in certain modes according to various control signals supplied from an external source, output buffer circuit 8 for outputting data read from memory array 1 from DQ terminal at a predetermined timing, and phase synchronizing circuit 9 for synchronizing the data output timing of output buffer circuit 8 with a system clock signal CLK.

Data stored in memory array 1 are read by a sense amplifier (not shown) and transferred to output buffer circuit 8. Data to be stored in the DRAM are input through DQ terminal, and written into memory cells corresponding to write addresses by a driver circuit (not shown).

Control circuit 6 is supplied with various control signals including /RAS (Row Address Strobe command), /CAS (Column Address Strobe command), /WE (Write Enable), /CS (Chip Select), CKE (Clock Enable), CLK (Clock), /CLK, DM (input/output mask). The symbol "/" represents that the signal is significant when low in level.

Data read from memory array 1 by the non-illustrated sense amplifier is temporarily stored in a buffer memory (not shown), and output from output buffer circuit 8 through DQ terminal according to control signals that are generated by control circuit 6 and mode control circuit 7. Data input from an external source through DQ terminal is temporarily stored in the non-illustrated buffer memory, and written through a write amplifier (not shown) into memory array 1 according to control signals that are generated by control circuit 6 and mode control circuit 7. At this time, output buffer circuit 8 has its output impedance kept at a high level by a control signal from control circuit 6.

Phase synchronizing circuit 9 comprises a DLL, a PLL, or the like. Phase synchronizing circuit 9 uses a circuit (a delay monitor circuit to be described later on) having a delay similar to the delay in output buffer circuit 8 for monitoring the delay in output buffer circuit 8. Phase synchronizing circuit 9 generates compensating clock signal CLKOE for compensating for the monitored delay from system clock CLK, and supplies generated compensating clock signal CLKOE to output buffer circuit 8.

Output buffer circuit 8 outputs data in synchronism with compensating clock signal CLKOE supplied from phase synchronizing circuit 9. The circuit for monitoring the delay in output buffer circuit 8 has its output impedance and slew rate controlled, as with output buffer circuit 8, by control signals ϕ1 through ϕN, /ϕ1 through /ϕN to be described later on.

1st Embodiment:

An output buffer circuit according to a first embodiment of the present invention will be described below with reference to the drawings.

Figure 3:
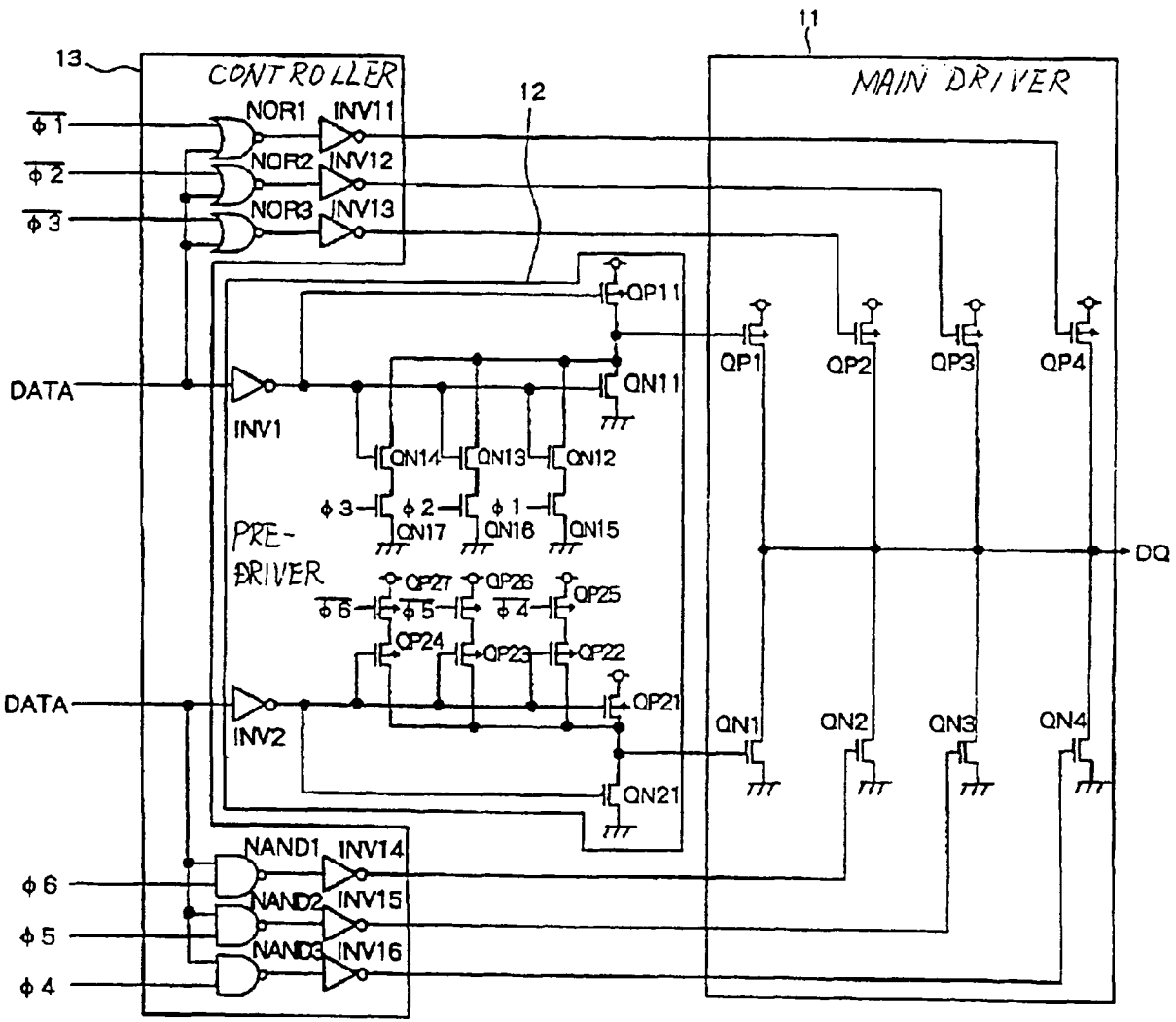
FIG. 3 is a circuit diagram of an output buffer circuit according to a first embodiment of the present invention.

As shown in FIG. 3, the output buffer circuit according to the first embodiment has main driver 11 for driving a load connected to DQ terminal, main driver 11 having an output impedance which can be changed, a predriver 12 for driving main driver 11 according to data (DATA) read from a sense amplifier and changing the ratio tr/tf of output pulses of main driver 11, and a controller 13 for generating signals to change the output impedance of main driver 11 and the ratio tr/tf of output pulses according to control signals ϕ1 through ϕ6 from a control circuit, etc. Control signals /ϕ1 through /ϕ6 shown in FIG. 3 are inversions of signals ϕ1 through ϕ6. Inverters for inverting signals ϕ1 through ϕ6 are omitted from the illustration in FIG. 3.

For example, control signals ϕ1 through ϕ6 are generated from a control circuit 6 according to commands supplied from an external integrated semiconductor circuit that contains an output buffer circuit shown in FIG. 3. The data receiving the output buffer circuit shown in FIG. 3 is a signal which is synchronous with compensating clock signal CLKOE supplied from phase synchronizing circuit 9 shown in FIG. 2.

Main driver 11 comprises four p-channel MOS transistors (hereinafter referred to as "pMOS transistors") QP1 through QP4 and four n-channel MOS transistors (hereinafter referred to as "nMOS transistors") QN1 through QN4.

[PMOS] *pMOS* transistors QP1 through QP4 have respective sources connected to a power supply, and nMOS transistors QN1 through QN4 have respective sources connected to a ground potential. pMOS transistors QP1 through QP4 and nMOS transistors QN1 through QN4 have respective drains connected to DQ terminal. pMOS transistor QP1 and nMOS transistor QN1 have respective gates connected to predriver 12, and pMOS transistors QP2 through QP4 and nMOS transistors QN2 through QN4 have respective gates connected to controller 13.

[PMOS] *pMOS* transistors QP2 through QP4 as well as pMOS transistor QP1 drive the load connected to DQ terminal to adjust the output impedance when high-level data is output from main driver 11. nMOS transistors QN2 through QN4 as well as nMOS transistor NP1 drive the load connected to DQ terminal to adjust the output impedance when low-level data is output from main driver 11.

pMOS transistors QP2 through QP4 and nMOS transistors QN2 through QN4 comprise transistors having a small device size (a narrow gate width) whose effect on the ratio tr/tf of output pulses is smaller than pMOS transistor QP1 and nMOS transistor QN1. The number of pMOS transistors connected parallel to pMOS transistor QP1 and the number of nMOS transistors connected parallel to nMOS transistor QN1 are not limited to three, but at least one pMOS transistor may be connected parallel to pMOS transistor QP1 and at least one nMOS transistor may be connected parallel to nMOS transistor QN1.

Predriver 12 comprise pMOS transistor QP11 and nMOS transistor QN11 for driving pMOS transistor QP1 of main driver 11, nMOS transistors QN12 through QN14 for adjusting the driving capability of nMOS transistor QN11 for driving pMOS transistor QP1, nMOS transistors QN15 through QN17 for turning on and off nMOS transistors QN12 through QN14, pMOS transistor QP21 and nMOS transistor QN21 for driving nMOS transistor QN1 of main driver 11, pMOS transistors QP22 through QP24 for adjusting the driving capability of pMOS transistor QP21 for driving nMOS transistor QN1, and pMOS transistors QP25 through QP27 for turning on and off pMOS transistors QP22 through QP24.

nMOS transistors QN15 through QN17 are controlled by respective control signals ϕ1 through ϕ3, and pMOS transistors PN25 through QP27 are controlled by respective control signals ϕ4 through ϕ6. In FIG. 3, predriver 12 has inverter INV1 for driving pMOS transistor QP11 and nMOS transistor QN11 according to the data (DATA) supplied from an external source, and inverter INV2 for driving pMOS transistor QP21 and nMOS transistor QN21 according to the data (DATA) supplied from the external source. However, inverters INV1, INV2 may be dispensed with if no logic problem arises, or may be replaced with driver circuits which do not invert logic levels.

nMOS transistors QN12 through QN14 as well as nMOS transistor QN11 drive pMOS transistor QP1 as a load to adjust the time for pMOS transistor QP1 to be turned on from an OFF state, i.e., the rise time tr of an output pulse of main driver 11. pMOS transistors QP22 through QP24 as well as [PMOS] *pMOS* transistor QP21 drive nMOS transistor QN1 as a load to adjust the time for nMOS transistor QN1 to be turned on from an OFF state, i.e., the fall time tf of an output pulse of main driver 11. The number of nMOS transistors connected to nMOS transistor QN11 and the number of pMOS transistors connected to [PMOS] *pMOS* transistor QP21 are not limited to three, but at least one nMOS transistor may be connected to nMOS transistor QN11 and at least one pMOS transistor may be connected to pMOS transistor QP21.

Controller 13 is a logic circuit which comprises OR gates NOR1 through NOR3, AND gates NAND1 through NAND3, and inverters INV11 through INV16 for generating signals for turning on and off pMOS transistors QP2 through QP4 and nMOS transistors QN2 through QN4 of main driver 11 and nMOS transistors QN15 through QN17 and pMOS transistors QP25 through QP27 of predriver 12 according to control signals ϕ1 through ϕ6, In FIG. 3, the ON/OFF states of nMOS transistors QN15 through QN17 are controlled by control signals ϕ1 through ϕ3 thereby to drive nMOS transistors QN12 through QN14 as well as nMOS transistor QN11, and the ON/OFF states of pMOS transistors QP25 through QP27 are controlled by control signals ϕ4 through ϕ6 thereby to drive pMOS transistors QP22 through QP24 as well as pMOS transistor QP21.

As with main driver 11, predriver 12 may be arranged such that nMOS transistors QN12 through QN14 and pMOS transistors QP22 through QP24 are driven directly by control signals output from the logic circuit of controller 13.

Conversely, as with predriver 12, main driver 11 may have pMOS transistors XP2 through XP4 connected in series to pMOS transistors QP2 through QP4 and nMOS transistors XN2 through XN4 connected in series to nMOS transistors QN2 through QN4, and may be arranged such that the ON/OFF states of pMOS transistors XP2 through XP4 and nMOS transistors XN2 through XN4 are controlled by control signals output from the logic circuit of controller 13.

For adjusting the output impedance of the output buffer circuit shown in FIG. 3, the level of control signals ϕ1 through ϕ3 is rendered low to turn on corresponding pMOS transistors QP2 through QP4 to lower the output impedance at the high-level data is output. At this time, the greater the number of pMOS transistors that are turned on, the smaller the output impedance. Similarly, the level of control signals ϕ4 through ϕ6 is rendered high to turn on corresponding nMOS transistors QN2 through QN4 to lower the output impedance at the low-level data is output. At this time, the greater the number of nMOS transistors that are turned on, the smaller the output impedance.

For adjusting the ratio tr/tf (slew rate) of output pulses, the level of control signals ϕ1 through ϕ3 is rendered high to turn on corresponding nMOS transistors QN12 through QN14 to shorten the rise time tr upon switching from the low-level data to the high-level data. At this time, the greater the number of nMOS transistors that are turned on, the shorter the rise time tr. Similarly, the level of control signals ϕ4 through ϕ6 is rendered low to turn on corresponding pMOS transistors QP22 through QP24 to shorten the fall time tf upon switching from the high-level data to the low-level data. At this time, the greater the number of pMOS transistors that are turned on, the shorter the fall time tf.

In the present embodiment, the output impedance is adjusted and the ratio tr/tf are adjusted simultaneously. For example, when control signal /ϕ1 is rendered low and control signal ϕ4 is rendered high in order to lower the output impedance by one stage, control signal ϕ1 which is an inversion of control signal /ϕ1 goes high, turning on nMOS transistors QN12, QN15, and control signal /ϕ4 which is an inversion of control signal ϕ4 goes low, turning on pMOS transistors QP22, QP25. Therefore, the ratio tr/tf is reduced by one stage. Similarly, when the output impedance is lowered by two stages, the ratio tr/tf is reduced by two stages, and when the output impedance is lowered by three stages, the ratio tr/tf is reduced by three stages. The output impedance and the rise time tr at the time the high-level data is output and the output impedance and the rise time tf at the time the low-level data is output can be adjusted independently of each other.

As described above, [PMOS] *pMOS* transistors QP2 through QP4 and nMOS transistors QN2 through QN4 comprise transistors having a small device size whose effect on the ratio tr/tf is smaller than pMOS transistor QP1 and nMOS transistor QN1. In FIG. 3, the ratio tr/tf is adjusted using only pMOS transistor QP1 and nMOS transistor QN1.

If pMOS transistors QP2 through QP4 and nMOS transistors QN2 through QN4 have a large device size, it is possible to adjust the ratio tr/tf with each of the transistors. In that case, however, the circuit scale is relatively large because it is necessary to add the same arrangement as predriver 12 in place of each of inverters INV11 through INV16. Therefore, it is preferable as shown in FIG. 3 to adjust the ratio tr/tf with the pair of [PMOS] *pMOS* transistors QP1 and nMOS transistor QN1.

Figure 4:
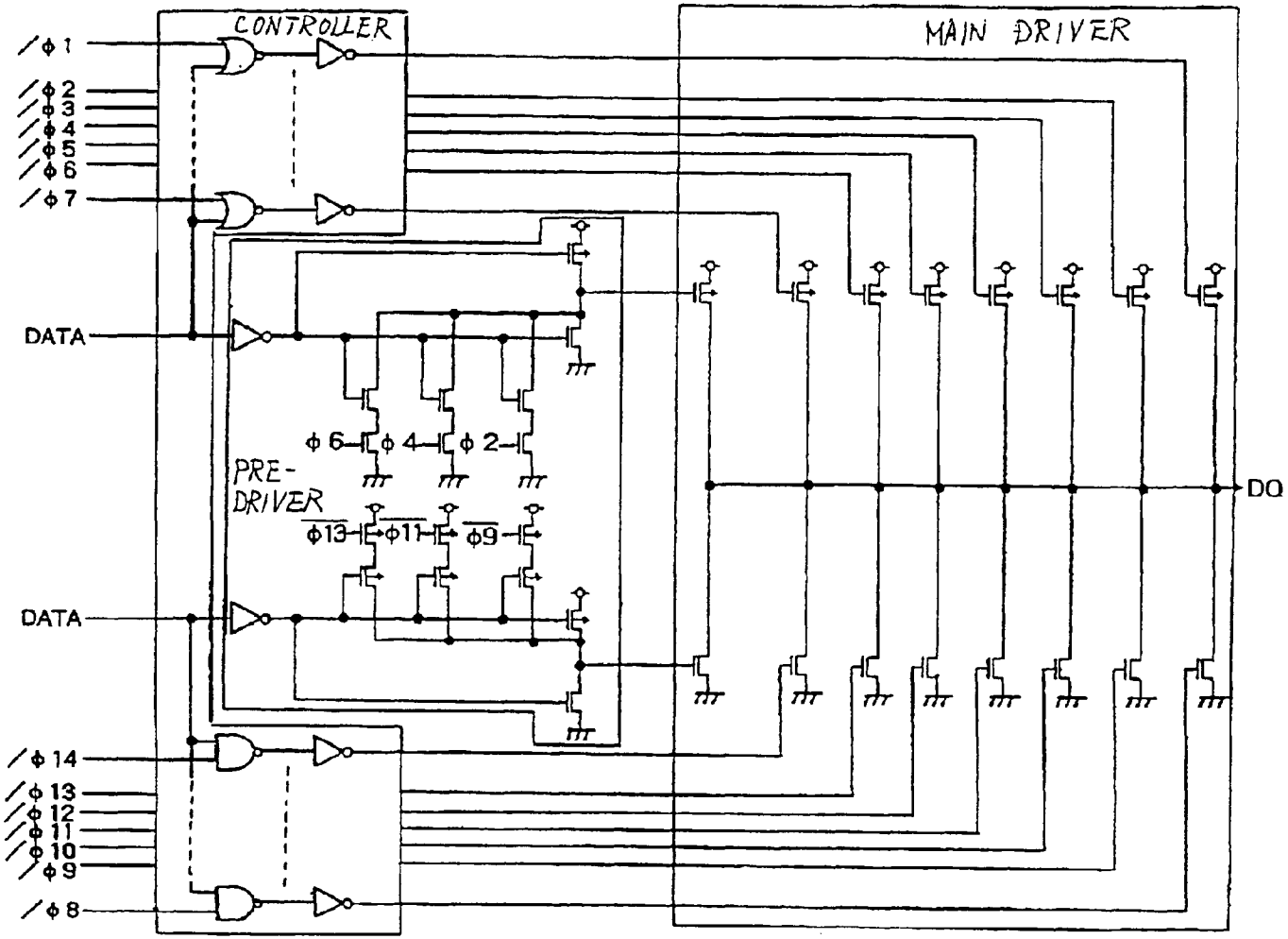
FIG. 4 is a circuit diagram of a modification of the output buffer circuit according to the first embodiment.

In FIG. 3, the number of stages for adjusting the output impedance and the number of stages for adjusting the ratio tr/tf are the same as each other. However, the number of stages for adjusting the output impedance and the number of stages for adjusting the ratio tr/tf are not required to be the same as each other, but may be different from each other. For example, as shown in FIG. 4, the main driver may have eight pairs of pMOS transistors and nMOS transistors for adjusting the output impedance in seven stages, and the ratio tr/tf may be adjusted in three stages as with the circuit shown in FIG. 3.

Generally, as the output impedance of an output buffer circuit increases due to variations in the power supply voltage and the ambient temperature, the ratio tr/tf of output pulses tends to be greater (longer). Therefore, if the relationship between changes in the output impedance of the output buffer circuit and changes in the ratio tr/tf is determined in advance, then, since a corrective quantity for the ratio tr/tf of output pulses is known for a corrective quantity for the output impedance, the output impedance and the ratio tr/tf can simultaneously be corrected by one control signal. Consequently, the data receiving side is prevented from malfunctioning, making it possible to achieve a system which operates normally even when the power supply voltage and the ambient temperature vary.

Figure 5:
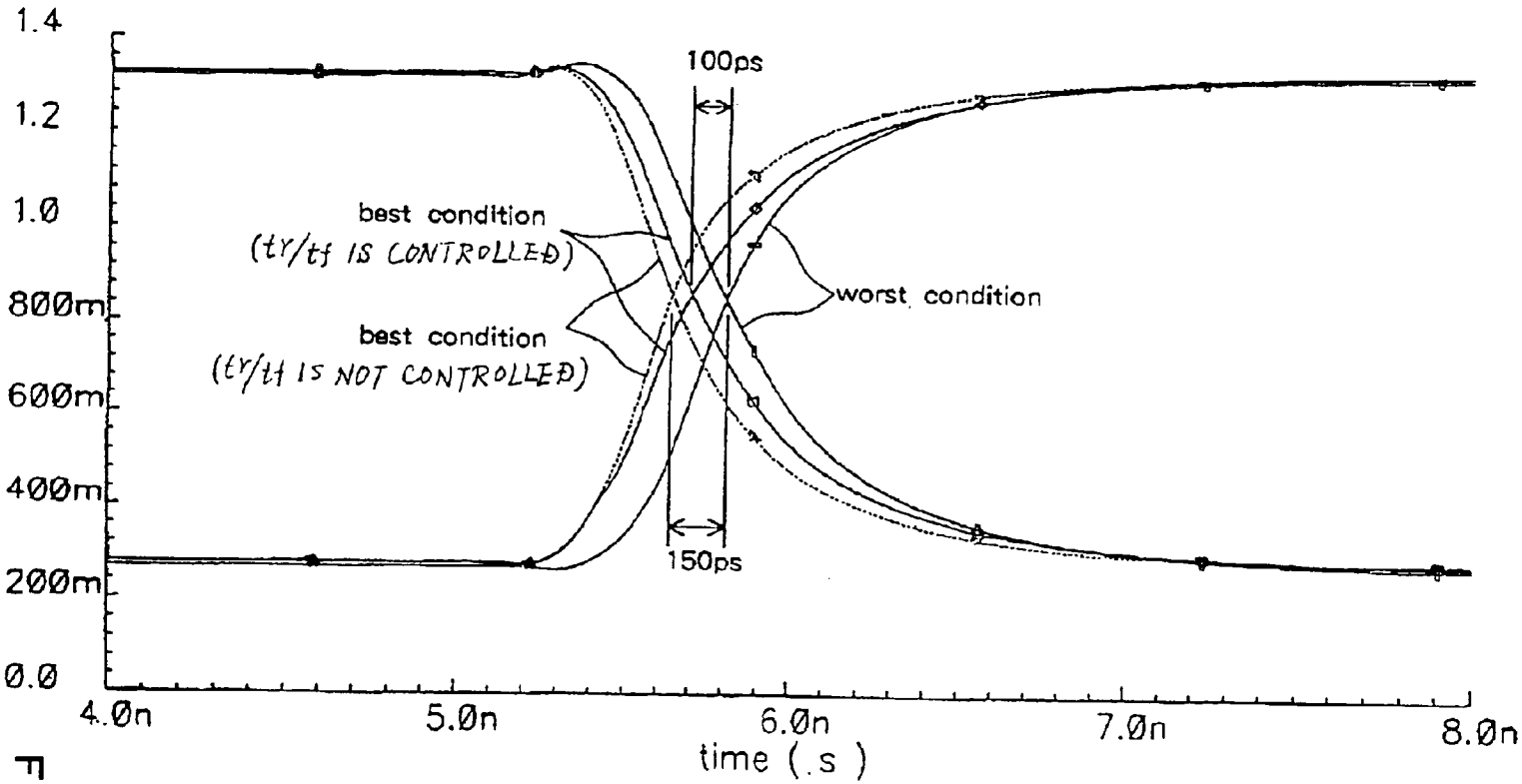
FIG. 5 is a waveform diagram showing the results of a simulation of output pulses produced when the ratio tr/tf of the output buffer circuit according to the first embodiment is controlled and when the ratio tr/tf is not controlled.

According to the present embodiment, the output buffer circuit is controlled to increase the output impedance and increase the ratio tr/tf to compensate for fluctuations in the output level of the output buffer circuit and the cross-point of the output signal. For example, as indicated by the results of a simulation shown in FIG. 5, when the ratio tr/tf is controlled, a range of variations of the cross-point of the ratio tr/tf is reduced to about ⅔ of the range of variations of the cross-point when the ratio tr/tf is not controlled. FIG. 5 shows the ratio tr/tf in best conditions when the ratio tr/tf is controlled and when the ratio tr/tf is not controlled against the ratio tr/tf in worst conditions. In the results of the simulation shown in FIG. 5, the output impedance is controlled both when the ratio tr/tf is controlled and when the ratio tr/tf is not controlled.

Figure 6:
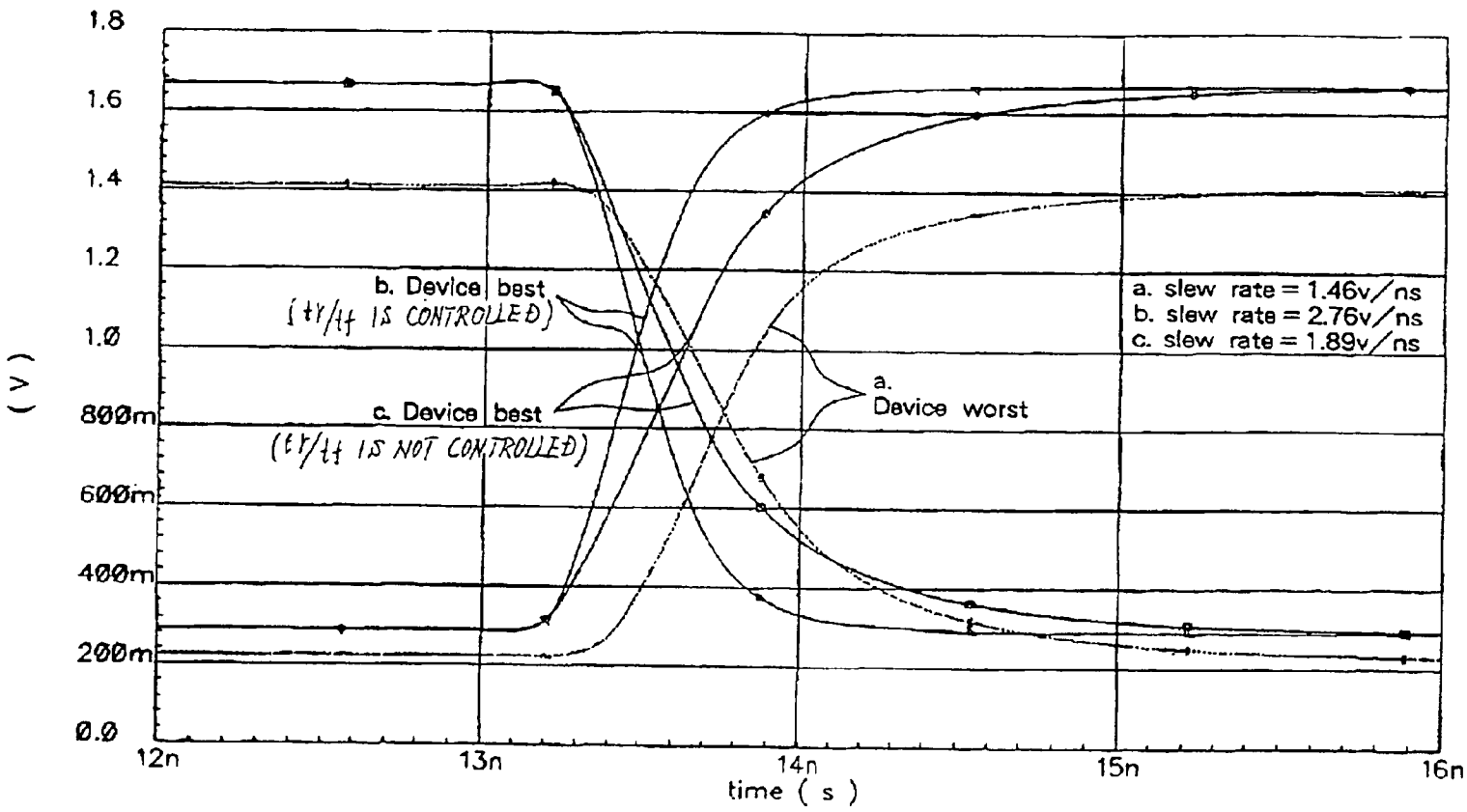
FIG. 6 is a waveform diagram showing the results of a simulation of output pulses produced when the ratio tr/tf of the output buffer circuit according to the first embodiment is controlled and when the ratio tr/tf is not controlled.

FIG. 6 shows the results of a simulation which indicate that when the ratio tr/tf is controlled, the range of variations of the slew rate is reduced to about ⅓ of the range of variations of the slew rate when the ratio tr/tf is not controlled. FIG. 6 illustrates waveforms (a: Device worst) when the ratio tr/tf is not controlled, the power supply voltage is minimum, and the device is at a high temperature at which the slew rate is lowest, waveforms (b: Device best) when the ratio tr/tf is not controlled, the power supply voltage is maximum, and the device is at a low temperature at which the slew rate is highest, and waveforms (c: Device best) when the ratio tr/tf is controlled, the power supply voltage is maximum, and the device is at a low temperature at which the slew rate is highest. In the results of the simulation shown in FIG. 6, the output impedance is controlled both when the ratio tr/tf is controlled and when the ratio tr/tf is not controlled.

With the output buffer circuit according to the present embodiment, the output impedance is adjusted and the ratio tr/tf of output pulses is controlled at the same time for thereby reducing the number of control signals and the number of testing steps. Accordingly, the manufacturing cost of the output buffer circuit is prevented from increasing, and it is not necessary to conduct a complex test unlike the situation where the output impedance and the ratio tr/tf of output pulses are controlled independently of each other. If only the output impedance of the output buffer circuit is monitored and adjusted, then since the slew rate is automatically improved, the performance of a system which employs the integrated semiconductor circuit device incorporating the output buffer circuit according to the present embodiment can be improved.

2nd Embodiment:

An output buffer circuit according to a second embodiment of the present invention will be described below with reference to the drawings.

Figure 7:
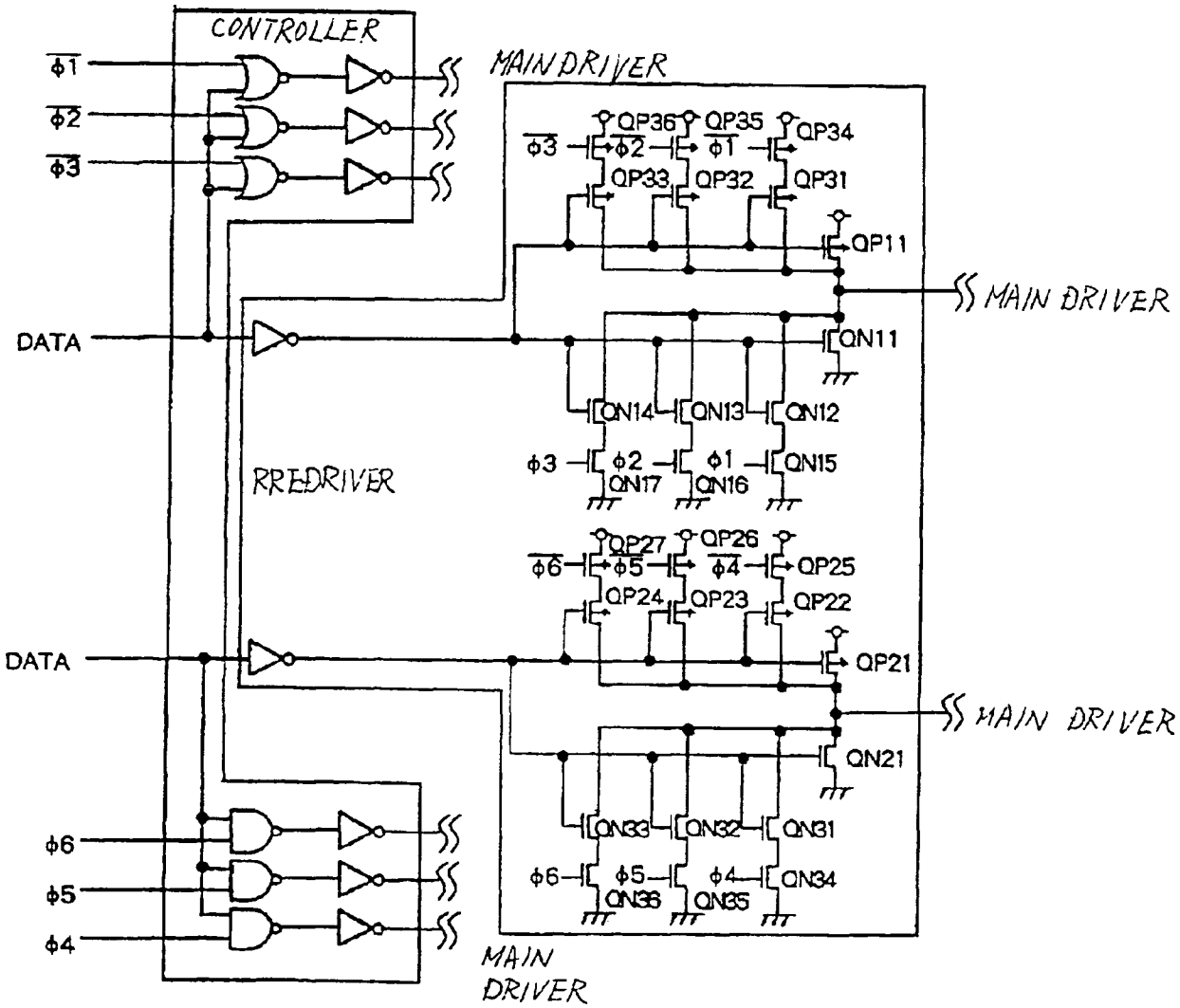
FIG. 7 is a circuit diagram of an output buffer circuit according to a second embodiment of the present invention.

As shown in FIG. 7, the output buffer circuit according to the second embodiment includes, in addition to the components of the predriver of the output buffer circuit according to the first embodiment shown in FIG. 3, pMOS transistors QP31 through QP33 for increasing the driving capability of the pMOS transistor QP11 for driving the pMOS transistor QP1, pMOS transistors QP34 through QP36 for turning on and off pMOS transistors QP31 through QP33, nMOS transistors QN31 through QN33 for increasing the driving capability of the nMOS transistor QN21 for driving the nMOS transistor QN1, and nMOS transistors QN34 through QN36 for turning on and off nMOS transistors QN31 through QN33.

pMOS transistors QP34 through QP36 are controlled by respective control signals /ϕ1 through /ϕ3, and nMOS transistors QN34 through QN36 are controlled by respective control signals [/ϕ4] *ϕ4* through ϕ6. Therefore, the ON/OFF states of pMOS transistors QP31 through QP33 are controlled at the same timing as nMOS transistors QN12 through QN14 shown in FIG. 3, and the ON/OFF states of nMOS transistors QN31 through QN33 are controlled at the same timing as pMOS transistors QP22 through QP24 shown in FIG. 3. Other structural and operational details of the output buffer circuit according to the second embodiment are identical to those of the output buffer circuit according to the first embodiment, and will not be described below.

In the first embodiment, of pMOS transistor QP11 and nMOS transistor QN11 which are provided to drive pMOS transistor QP1 of the main driver, only nMOS transistor QN11 has its driving capability increased, and of pMOS transistor QP21 and nMOS transistor QN21 which are provided to drive nMOS transistor QN1 of the main driver, only pMOS transistor QP11 has its driving capability increased.

Figure 8:
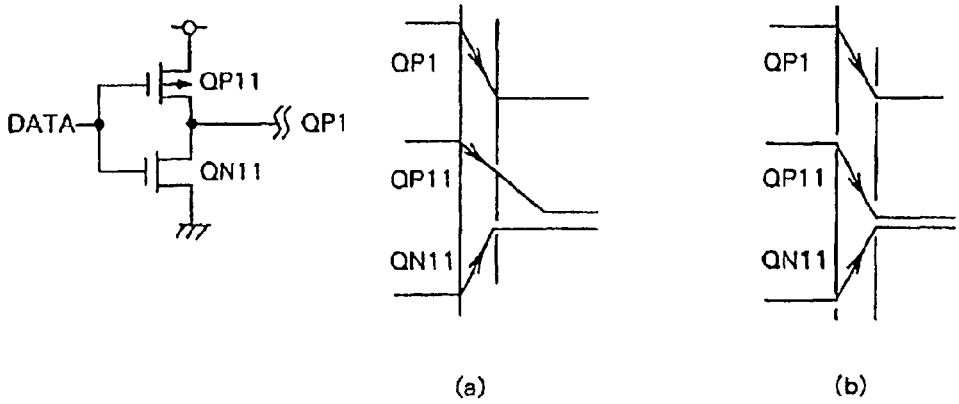
FIG. 8 is a circuit diagram of a portion of the output buffer circuit according to the present invention and waveform diagrams showing the manner in which that portion of the output buffer circuit operates.

With such an arrangement, when pMOS transistor QP11 switches from the ON state to the OFF state and the nMOS transistor QN11 switches from the OFF state to the ON state, as shown in FIG. 8(a), if the speed of switching from the OFF state to the ON state increases because of the large driving capability of nMOS transistor QN11, then there occur periods of time in which pMOS transistor QP11 and nMOS transistor QN11 are turned on, allowing a through current to flow from the power supply to the ground potential. The through current serves as a noise source, and tends to increase the current consumption of the output buffer circuit.

In the present embodiment, pMOS transistors QP31 through QP36 are added to the arrangement shown in FIG. 3 to increase the driving capabilities of both pMOS transistor QP11 and nMOS transistor QN11 as shown in FIG. 8(b). The arrangement according to the second embodiment offers the advantages of the output buffer circuit according to the first embodiment, and is additionally effective to prevent noise from being produced and the current consumption from being increased by the through current. Similarly, nMOS transistors QN31 through QN36 are added to the arrangement shown in FIG. 3 to increase the driving capabilities of both pMOS transistor QP21 and nMOS transistor QN21 prevent noise from being produced and the current consumption from being increased by the through current.

In the output buffer circuit according to the second embodiment, the number of stages for adjusting the output impedance and the number of stages for adjusting the ratio tr/tf are not required to be the same as each other, but may be different from each other as with the arrangement shown in FIG. 4 according to the first embodiment.

3rd Embodiment:

According to a third embodiment, the arrangements of the output buffer circuits according to the first and second embodiments are applied to another circuit.

Figure 9:
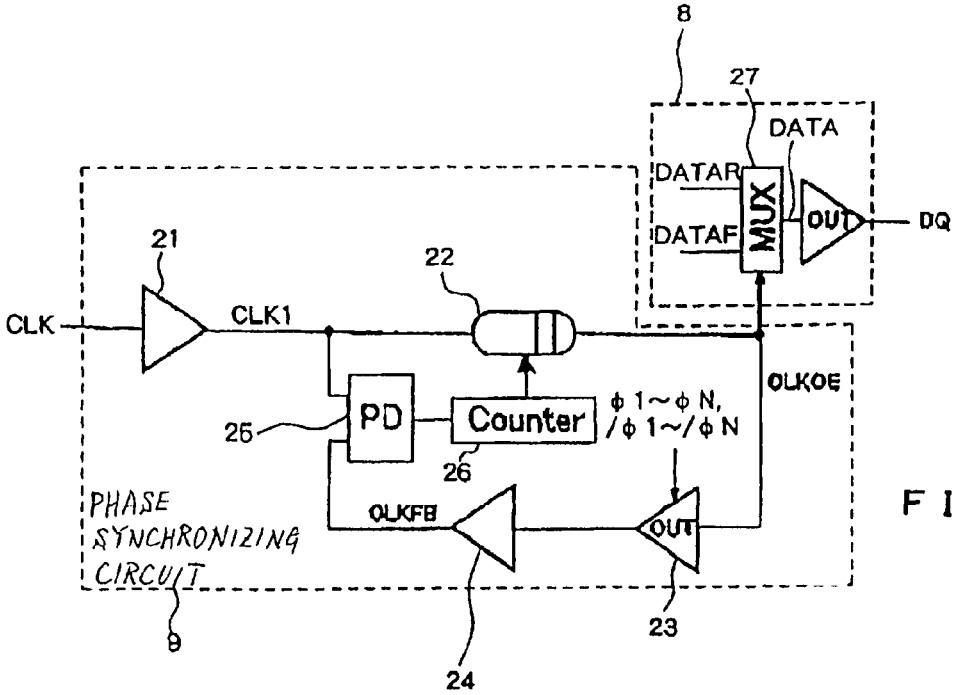
FIG. 9 is a block diagram of a phase synchronizing circuit which operates as shown in FIG. 1.

As described above, an integrated semiconductor circuit device such as a DDR-SDRAM or the like which operates at a high speed incorporates phase synchronizing circuit 9 for synchronizing data output from output buffer circuit 8 with system clock signal CLK, as shown in FIG. 9.

Phase synchronizing circuit 9 comprises a DLL as shown in FIG. 9, for example. Phase synchronizing circuit 9 has input buffer circuit 21 for being supplied with system clock signal CLK, variable delay circuit 22 for delaying clock signal CLK1 output from input buffer circuit 21 to generate compensating clock signal CLKOE for compensating for output data timing of output buffer circuit 8, delay monitor circuit 23 for being supplied with compensating clock signal CLKOE and monitoring a delay of output buffer circuit 8, input buffer replica circuit 24 for being supplied with an output signal from delay monitor circuit 23 and outputting feedback clock signal CLKFB as a monitored full delay, input buffer replica circuit 24 having a delay equal to the delay of input buffer circuit 21, phase comparator (PD) 25 for outputting a value proportional to the phase difference between clock signal CLK1 output from input buffer circuit 21 and feedback clock signal CLKFB, and counter (Counter) 26 for controlling the delay produced by variable delay circuit 22 according to the output value from phase comparator 25.

Since phase synchronizing circuit 9 operates to bring clock signal CLK1 output from input buffer circuit 21 into phase with feedback clock signal CLKFB (precisely, feedback clock signal CLKFB is in phase with clock signal CLK1 with a one period delay), compensating clock signal CLKOE output from variable delay circuit 22 has phase information for canceling out delays caused by delay monitor circuit 23 and input buffer replica circuit 24.

Therefore, by synchronizing data (DATAR, DATAF) read from memory array 1 with compensating clock signal CLKOE using multiplexer (MUX) 27, the data output from output buffer circuit 8 can be synchronized with system clock signal CLK.

Delay monitor circuit 23 having the same delay as output buffer circuit 8 may comprise an extra output buffer circuit incorporated in the integrated semiconductor circuit device for monitoring the delay. However, in order to reduce the current consumption and the circuit area, it is preferable to employ a circuit (replica circuit) which is identical in construction to the output buffer circuit and which has transistors reduced in size.

The output terminal of the replica circuit may be connected to a dummy load determined from an actual load (represented by a simulated value) based on the ratio of transistor sizes of the output buffer circuit and the replica circuit for monitoring changes in the delay of the output buffer circuit due to variations in the ambient temperature and the power supply voltage. In FIG. 9, the dummy load is included in the replica circuit (delay monitor circuit 9).

Figure 10A:
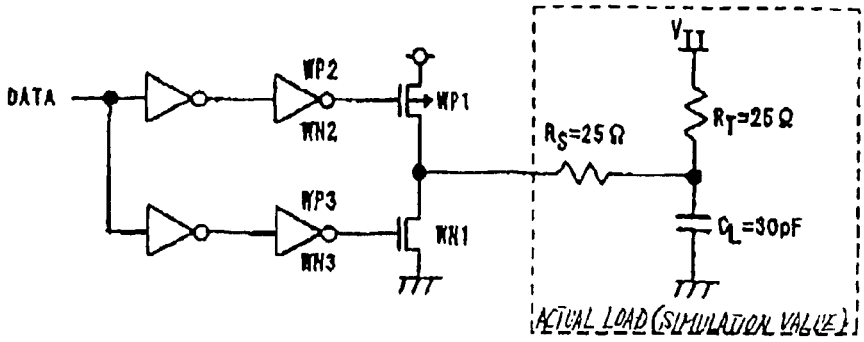
FIGS. 10A and 10B are circuit diagrams showing examples in which a delay monitor circuit is used.
Figure 10B:
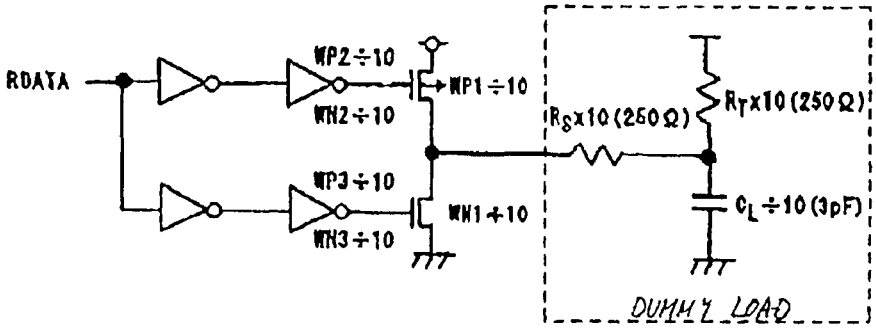

For example, as shown in FIG. 10A, if the actual load has a load resistance $R_T$ of 25 Ω, a load capacitance $C_L$ of 30 pF, and an actual interconnection resistance $R_S$ of 25 Ω, and the size of each of the transistors of the replica circuit is 1/10 of the size of each of the transistors of output buffer circuit 8, then, as shown in FIG. 10B, the dummy load may have a load resistance ($R_T$ of 250 Ω) which is ten times the load resistance of the actual load, a load capacitance ($C_L$ of 3 pF) which is 1/10 of the load capacitance of the actual load, and an interconnection resistance ($R_S$ of 250 Ω) which is ten times the actual interconnection resistance. The dummy load does not need to have a circuit (e.g., a load replica) whose resistance and capacitance vary depending on variations in the ambient temperature and the power supply voltage, and may be arranged to be unsusceptible to such variations.

pMOS transistor WP1 shown in FIGS. 10A and 10B represents all pMOS transistors QP1 through QP4 of the main driver shown in FIG. 3. nMOS transistor WN1 shown in FIGS. 10A and 10B represents all nMOS transistors QN1 through QN4 of the main driver shown in FIG. 3. Similarly, inverters WP2, WN2 shown in FIGS. 10A and 10B represent all pMOS transistors QP11, QP31 through QP36, nMOS transistors QN11 through QN17 of the predrivers shown in FIGS. 3 and 7, and inverters WP3, WN3 shown in FIGS. 10A and 10B represent all pMOS transistors QP21 through QP27, nMOS transistors QN21, QN31 through QN36 of the predrivers shown in FIGS. 3 and 7.

In FIGS. 10A and 10B, the controllers shown in FIGS. 3 and 7, and control signals [ϕ1 through ϕ6, ϕ1 through /ϕ6] *ϕ1 through ϕ6, /ϕ1 through/ϕ6* which are supplied from the controller to pMOS transistors QP2 through QP4 and nMOS transistors QN2 through QN4 of the main driver, and pMOS transistors QP25 through QP27, pMOS transistors QP34 through QP36, nMOS transistors QN15 through QN17, and nMOS transistors QN34 through QN36 of the predriver are omitted from the illustration. However, the circuit arrangement shown in FIGS. 10A and 10B has those controller and control signals as with the circuit arrangements shown in FIGS. 3 and 7.

Data RDATA (=CLKOE) input to the replica circuit switches between "0" and "1" at a predetermined period unlike data DATA input to the output buffer circuit.

In the present embodiment, delay monitor circuit 23 shown in FIG. 9 is of the same arrangement as the output buffer circuit according to the first embodiment or the second embodiment, and is made up of transistors whose device size is smaller than those of the output buffer circuit. As with the first and second embodiments, the transistors are operated by control signals ϕ1 through ϕN, /ϕ1 through /ϕN (N is a positive integer) to control the output impedance of delay monitor circuit 23 and the ratio tr/tf of output pulses. The numbers of stages for adjusting the output impedance of the delay monitor circuit and the output buffer circuit and the numbers of stages for adjusting the ratio tr/tf thereof are not required to be the same as each other. The numbers of adjusting stages for the delay monitor circuit may be smaller than the numbers of adjusting stages for the output buffer circuit.

If an integrated semiconductor circuit device employs output buffer circuit 8 according to the first or second embodiment, then since delay monitor circuit 23 reflects the adjusted values of the output impedance of output buffer circuit 8 and the ratio tr/tf of output pulses, system clock signal CLK and the data output from the output buffer circuit can be synchronized more accurately with each other using phase synchronizing circuit 9.

Figure 11:
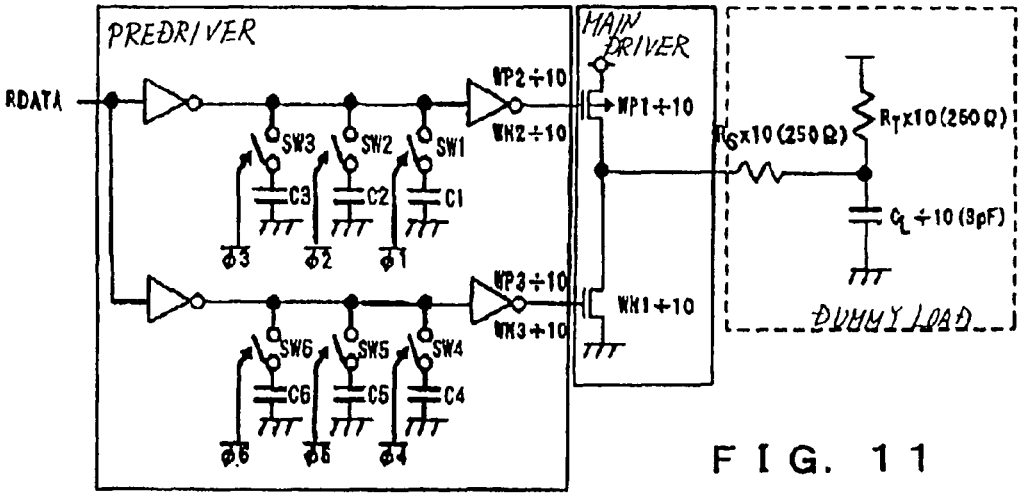
FIG. 11 is a circuit diagram of a delay monitor circuit incorporated in the integrated semiconductor circuit device according to the present invention.

Delay monitor circuit 23 may only adjust the delay which varies depending on the output impedance and the ratio tr/tf of output pulses which have been adjusted by output buffer circuit 8. Therefore, as shown in FIG. 11, a predriver in delay monitor circuit 23 which is arranged not to control the output impedance and the ratio tr/tf of output pulses may have a plurality of capacitors (C1 through C6 in FIG. 11) for changing the delay, and a plurality of switches (SW1 through SW6 in FIG. 11) for connecting the capacitors to output terminals of inverters INV1, INV2, for thereby controlling the ON/OFF states of the switches with control signals /ϕ1 through /ϕN (N=6 in FIG. 11). The delay caused by each of the capacitors may be equalized to a delay after the output impedance of the output buffer circuit and the ratio tr/tf of output pulses have been adjusted for achieving the above advantages.

Each of [PMOS] *pMOS* transistor WP1 and nMOS transistor WN1 shown in FIG. 11 may comprise a single MOS transistor, unlike the arrangement shown in FIG. 3, and each of inverters (WP2, WN2), (WP3, WN3) may comprise a set of pMOS and nMOS transistors unlike the arrangement shown in FIG. 3.

While preferred embodiments of the present invention have been described in specific terms, such description is for illustrative purposes only, and it is to be understood that changes and variations may be made without departing from the spirit or scope of the following claims.

What is claimed is:

1. An output buffer circuit for outputting data in the form of an input pulse train at a predetermined output impedance and slew rate, comprising:

a main driver having at least a pair of a first p-channel MOS transistor and a first n-channel MOS transistor for driving a load according to said data, and at least a pair of a second p-channel MOS transistor and a second n-channel MOS transistor for driving said load in coaction with said first p-channel MOS transistor and said first n-channel MOS transistor;

a predriver with outputs for driving only said first [in-channel] *in channel* MOS transistor and only said first p-channel MOS transistor having at least a pair of a third p-channel MOS transistor and a third n-channel MOS transistor for driving said first p-channel MOS transistor according to said data, at least a pair of a fourth p-channel MOS transistor and a fourth n-channel MOS transistor for driving said first n-channel MOS transistor according to said data, at least one fifth n-channel MOS transistor for driving said first p-channel MOS transistor in coaction with said third n-channel MOS transistor, and at least one fifth p-channel MOS transistor for driving said first n-channel MOS transistor in coaction with said fourth p-channel MOS transistor; and a controller for generating control signals to control said fifth n-channel MOS transistor into and out of operation in coaction with said second p-channel MOS transistor, and control said fifth p-channel MOS transistor into and out of operation in coaction with said second n-channel MOS transistor, wherein the output of the predriver is directly connected only to said first p-channel MOS transistor and said first n-channel MOS transistor of said main driver.

2. The output buffer circuit according to claim 1, wherein the number of said second p-channel MOS transistors and said second n-channel MOS transistors and the number of said fifth n-channel MOS transistors and said fifth p-channel MOS transistors are equal to each other.

3. The output buffer circuit according to claim 1, wherein the number of said second p-channel MOS transistors and said second n-channel MOS transistors and the number of said fifth n-channel MOS transistors and said fifth p-channel MOS transistors are different from each other.

4. The output buffer circuit according to claim 1, wherein said second p-channel MOS transistor and said second n-channel MOS transistor have a smaller device size with a smaller gate width than said first p-channel MOS transistor and said first n-channel MOS transistor, and have a small effect on rise and fall times of pulses output from said main driver.

5. An output buffer circuit for outputting data in the form of an input pulse train at a predetermined output impedance and slew rate, comprising:

a main driver [with outputs for driving only said first n-channel MOS transistor and only said first p-channel MOS transistor] *with outputs for driving only said first n channel MOS transistor and only said first p channel MOS transistor* having at least a pair of a first p-channel MOS transistor and a first n-channel MOS transistor for driving a load according to said data, and at least a pair of a second p-channel MOS transistor and a second n-channel MOS transistor for driving said load in coaction with said first p-channel MOS transistor and said first n-channel MOS transistor;

a predriver *with outputs for driving only said first n-channel MOS transistor and only said first p-channel MOS transistor* having at least a pair of a third p-channel MOS transistor and a third n-channel MOS transistor for driving said first p-channel MOS transistor according to said data, at least a pair of a fourth p-channel MOS transistor and a fourth n-channel MOS transistor for driving said first n-channel MOS transistor according to said data, at least one fifth n-channel MOS transistor for driving said first p-channel MOS transistor in coaction with said third n-channel MOS transistor, at least one fifth p-channel MOS transistor for driving said first p-channel MOS transistor in coaction with said third p-channel MOS transistor, at least one sixth p-channel MOS transistor for driving said first n-channel MOS transistor in coaction with said fourth p-channel MOS transistor, and at least one sixth n-channel MOS transistor for driving said first n-channel MOS transistor in coaction with said fourth n-channel MOS transistor; and a controller for generating control signals to control said fifth p-channel MOS transistor and said fifth n-channel MOS transistor into and out of operation in coaction with said second p-channel MOS transistor, and control said sixth p-channel MOS transistor and said sixth n-channel MOS transistor into and out of operation in coaction with said second n-channel MOS transistor, wherein the output of the predriver is directly connected only to said first p-channel MOS transistor and said first n-channel MOS transistor of said main driver.

6. The output buffer circuit according to claim 5, wherein the number of said second p-channel MOS transistors and said second n-channel MOS transistors, and the number of said fifth n-channel MOS transistors, said fifth p-channel MOS transistor, said sixth n-channel MOS transistor, and said sixth p-channel MOS transistor are equal to each other.

7. The output buffer circuit according to claim 5, wherein the number of said second p-channel MOS transistors and said second n-channel MOS transistors, and the number of said fifth n-channel MOS transistors, said fifth p-channel MOS transistors, said sixth n-channel MOS transistors, and said sixth p-channel MOS transistors are different from each other.

8. The output buffer circuit according to claim 5, wherein said second p-channel MOS transistor and said second n-channel MOS transistor have a smaller device size with a smaller gate width than said first p-channel MOS transistor and said first n-channel MOS transistor, and have a small effect on rise and fall times of pulses output from said main driver.

9. An integrated semiconductor circuit device comprising:

an output buffer circuit according to claim 1; and a delay monitor circuit identical in circuit arrangement to said output buffer circuit and having transistors controlled according to said control signals in the same manner as with said output buffer circuit, said delay monitor circuit having an output terminal connected to a dummy load determined from an actual load of said output buffer circuit based on a transistor size ratio between said output buffer circuit and said delay monitor circuit.

10. An integrated semiconductor circuit device comprising:

an output buffer circuit according to claims 5; and a delay monitor circuit identical in circuit arrangement to said output buffer circuit and having transistors controlled according to said control signals in the same manner as with said output buffer circuit, said delay monitor circuit having an output terminal connected to a dummy load determined from an actual load of said output buffer circuit based on a transistor size ratio between said output buffer circuit and said delay monitor circuit.

11. The integrated semiconductor circuit device according to claim 9, wherein said delay monitor circuit has transistors having a smaller device size with a smaller gate width than the transistors of said output buffer circuit.

12. The integrated semiconductor circuit device according to claim 10, wherein said delay monitor circuit has transistors having a smaller device size with a smaller gate width than the transistors of said output buffer circuit.

13. An integrated semiconductor circuit device comprising:

an output buffer circuit for outputting data in the form of an input pulse train at a predetermined output impedance and slew rate, said output buffer circuit comprising:

a main driver having at least a pair of a first p-channel MOS transistor and a first n-channel MOS transistor for driving a load according to said data, and at least a pair of a second p-channel MOS transistor and a second n-channel MOS transistor for driving said load in coaction with said first p-channel MOS transistor and said first n-channel MOS transistor;

a predriver having at least a pair of a third p-channel MOS transistor and a third n-channel MOS transistor for driving said first p-channel MOS transistor according to said data, at least a pair of a fourth p-channel MOS transistor and a fourth n-channel MOS transistor for driving said first n-channel MOS transistor according to said data, at least one fifth n-channel MOS transistor for driving said first p-channel MOS transistor in coaction with said third n-channel MOS transistor, and at least one fifth p-channel MOS transistor for driving said first n-channel MOS transistor in coaction with said fourth p-channel MOS transistor; and a controller for generating control signals to control said fifth n-channel MOS transistor into and out of operation in coaction with said second p-channel MOS transistor, and control said fifth p-channel MOS transistor into and out of operation in coaction with said second n-channel MOS transistor; and a phase synchronizing circuit including a delay monitor circuit comprising a plurality of capacitors for controlling the delay of the data output from said output buffer circuit by respective delays, and a plurality of switches for selectively enabling and disabling said capacitors to delay the data according to said control signals, said delay monitor circuit having an output terminal connected to a dummy load determined from an actual load of said output buffer circuit based on a transistor size ratio between said output buffer circuit and said delay monitor circuit.

14. The integrated semiconductor circuit device according to claim 13, wherein said delay monitor circuit has transistors having a smaller device size with a smaller gate width than the transistors of said output buffer circuit.

15. An integrated semiconductor circuit device comprising:

an output buffer circuit for outputting data in the form of an input pulse train at a predetermined output impedance and slew rate, said output buffer comprising:

a main driver having at least a pair of a first p-channel MOS transistor and a first n-channel MOS transistor for driving a load according to said data, and at least a pair of a second p-channel MOS transistor and a second n-channel MOS transistor for driving said load in coaction with said first p-channel MOS transistor and said first n-channel MOS transistor;

a predriver having at least a pair of a third p-channel MOS transistor and a third n-channel MOS transistor for driving said first p-channel MOS transistor according to said data, at least a pair of a fourth p-channel MOS transistor and a fourth n-channel MOS transistor for driving said first n-channel MOS transistor according to said data, at least one fifth n-channel MOS transistor for driving said first p-channel MOS transistor in coaction with said third n-channel MOS transistor, at least one fifth p-channel MOS transistor for driving said first p-channel MOS transistor in coaction with said third p-channel MOS transistor, at least one sixth p-channel MOS transistor for driving said first n-channel MOS transistor in coaction with said fourth p-channel MOS transistor, and at least one sixth n-channel MOS transistor for driving said first n-channel MOS transistor in coaction with said fourth n-channel MOS transistor; and a controller for generating control signals to control said fifth p-channel MOS transistor and said fifth n-channel MOS transistor into and out of operation in coaction with said second p-channel MOS transistor, and control said sixth p-channel MOS transistor and said sixth n-channel MOS transistor into and out of operation in coaction with said second n-channel MOS transistor, and a phase synchronizing circuit including a delay monitor circuit comprising a plurality of capacitors for controlling the delay of the data output from said output buffer circuit by respective delays, and a plurality of switches for selectively enabling and disabling said capacitors to delay the data according to said control signals, said delay monitor circuit having an output terminal connected to a dummy load determined from an actual load of said output buffer circuit based on a transistor size ratio between said output buffer circuit and said delay monitor circuit.

16. The integrated semiconductor circuit device according to claim 15, wherein said delay monitor circuit has transistors having a smaller device size with a smaller gate width than the transistors of said output buffer circuit.

* * * * *

UNITED STATES PATENT AND TRADEMARK OFFICE

CERTIFICATE OF CORRECTION

PATENT NO. : RE43,539 E
APPLICATION NO. : 11/798773
DATED : July 24, 2012
INVENTOR(S) : Tsugio Takahashi It is certified that error appears in the above-identified patent and that said Letters Patent is hereby corrected as shown below:

In claim 1, column 12, lines 64-65, delete "a predriver with outputs for driving only said first [in-channel] in channel MOS transistor and only said first", and insert the following:

-- a predriver with outputs for driving only said first n-channel MOS transistor and only said first --

In claim 5, column 13, lines 40-44, delete "a main driver [with outputs for driving only said first n-channel MOS transistor and only said first p-channel MOS transistor] with outputs for driving only said first n channel MOS transistor and only said first p channel MOS transistor having at least a pair of a first p-channel" , and insert the following:

-- a main driver having at least a pair of a first p-channel --

Signed and Sealed this
Nineteenth Day of March, 2013

Teresa Stanek Rea

Teresa Stanek Rea
*Acting Director of the United States Patent and Trademark Office*